US012628283B2

(12) United States Patent
Furutani

(10) Patent No.: US 12,628,283 B2
(45) Date of Patent: May 12, 2026

(54) WIRING SUBSTRATE

(71) Applicant: IBIDEN CO., LTD., Ogaki (JP)

(72) Inventor: Toshiki Furutani, Ibi-gun (JP)

(73) Assignee: IBIDEN CO., LTD., Ogaki (JP)

( * ) Notice: Subject to any disclaimer, the term of this patent is extended or adjusted under 35 U.S.C. 154(b) by 134 days.

(21) Appl. No.: 18/342,793

(22) Filed: Jun. 28, 2023

(65) Prior Publication Data

US 2024/0008191 A1      Jan. 4, 2024

(30) Foreign Application Priority Data

Jul. 1, 2022    (JP) ................................. 2022-107239

(51) Int. Cl.
 *H05K 1/11* (2006.01)
 *H05K 3/18* (2006.01)
 *H05K 3/46* (2006.01)

(52) U.S. Cl.
 CPC .......... *H05K 3/4661* (2013.01); *H05K 1/113* (2013.01); *H05K 3/182* (2013.01); *H05K 2201/0959* (2013.01); *H05K 2201/096* (2013.01)

(58) Field of Classification Search
 CPC .......... H05K 2201/096; H05K 3/4661; H05K 3/182; H05K 2201/0959; H05K 2203/124; H05K 3/389; H05K 3/4644; H05K 3/24; H05K 3/3457; H05K 2203/0591; H05K 1/111–115; H05K 1/0298

USPC ........................................................ 174/262
See application file for complete search history.

(56) References Cited

U.S. PATENT DOCUMENTS

| | | | |
|---|---|---|---|
| 2012/0300425 A1* | 11/2012 | Nakashima ....... | H01L 23/49838 361/761 |
| 2016/0066423 A1* | 3/2016 | Sakamoto ......... | H01L 23/49822 29/846 |
| 2017/0141023 A1* | 5/2017 | Arisaka ............. | H01L 23/49838 |
| 2018/0279486 A1* | 9/2018 | Matsumoto .......... | H05K 3/4626 |

FOREIGN PATENT DOCUMENTS

JP        2003-258410 A      9/2003

* cited by examiner

*Primary Examiner* — Stanley Tso
*Assistant Examiner* — Sidi M Maiga
(74) *Attorney, Agent, or Firm* — Finnegan, Henderson, Farabow, Garrett & Dunner, LLP

(57) ABSTRACT

A wiring substrate includes a first insulating layer, a conductor layer formed on the first insulating layer and including a wiring pattern, an organic coating film formed on the conductor layer such that the organic coating film is formed on the wiring pattern of the conductor layer, and a second insulating layer formed on the first insulating layer such that the second insulating layer is covering the conductor layer. The conductor layer is formed such that the wiring pattern has a polished surface on the opposite side with respect to the first insulating layer, and the organic coating film is formed on the wiring pattern of the conductor layer such that the organic coating film is covering the polished surface of the wiring pattern.

20 Claims, 11 Drawing Sheets

WIRING SUBSTRATE

CROSS-REFERENCE TO RELATED APPLICATIONS

The present application is based upon and claims the benefit of priority to Japanese Patent Application No. 2022-107239, filed Jul. 1, 2022, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2003-258410 describes a method of manufacturing a wiring substrate in which an electroless copper plating layer and an electrolytic copper plating layer are sequentially laminated on an insulating substrate to form a wiring pattern. The entire contents of this publication are incorporated herein by reference.

SUMMARY OF THE INVENTION

According to one aspect of the present invention, a wiring substrate includes a first insulating layer, a conductor layer formed on the first insulating layer and including a wiring pattern, an organic coating film formed on the conductor layer such that the organic coating film is formed on the wiring pattern of the conductor layer, and a second insulating layer formed on the first insulating layer such that the second insulating layer is covering the conductor layer. The conductor layer is formed such that the wiring pattern has a polished surface on the opposite side with respect to the first insulating layer, and the organic coating film is formed on the wiring pattern of the conductor layer such that the organic coating film is covering the polished surface of the wiring pattern.

According to another aspect of the present invention, a method of manufacturing a wiring substrate includes forming a conductor layer on a first insulating layer such that the conductor layer has a wiring pattern, forming an organic coating film on the conductor layer such that the organic coating film is formed on the wiring pattern of the conductor layer, and forming a second insulating layer on the first insulating layer such that the second insulating layer covers the conductor layer. The forming of the conductor layer includes forming a seed layer on the first insulating layer, forming a plating resist on the seed layer, forming an electrolytic plating film having a thickness larger than a thickness of the plating resist on the seed layer exposed from the plating resist, and polishing the electrolytic plating film and the plating resist such that the thickness of the electrolytic plating film and the thickness of the plating resist are reduced and that the wiring pattern has a polished surface on the opposite side with respect to the first insulating layer, and the forming of the organic coating film includes forming the organic coating film on the wiring pattern of the conductor layer such that the organic coating film covers the polished surface of the wiring pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view illustrating an example of a wiring substrate according to an embodiment of the present invention;

FIG. 4 is a cross-sectional view illustrating an example of a wiring substrate according to another embodiment of the present invention;

DETAILED DESCRIPTION OF THE EMBODIMENTS

Figure 2:
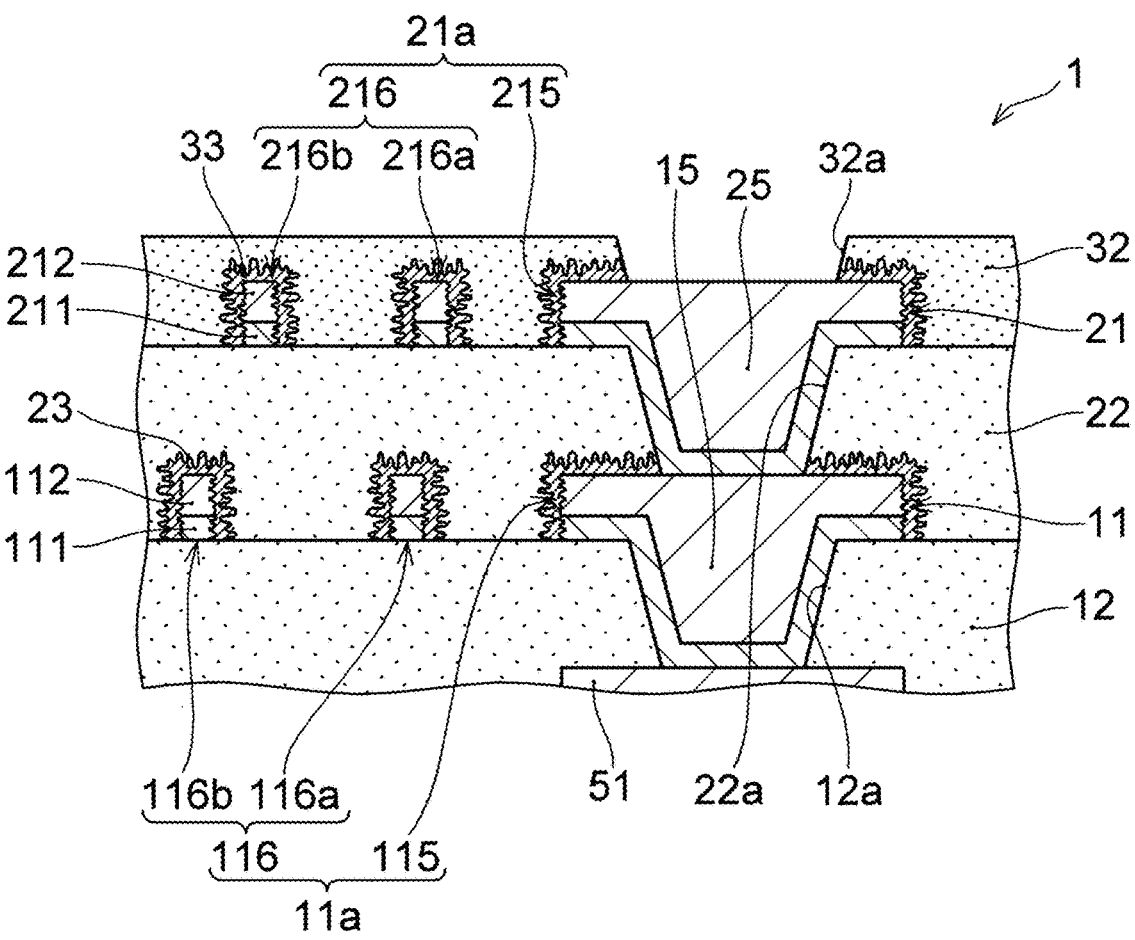
FIG. 2 is a partial enlarged cross-sectional view of the wiring substrate of FIG. 1.

Embodiments will now be described with reference to the accompanying drawings, wherein like reference numerals designate corresponding or identical elements throughout the various drawings.

Figure 1:
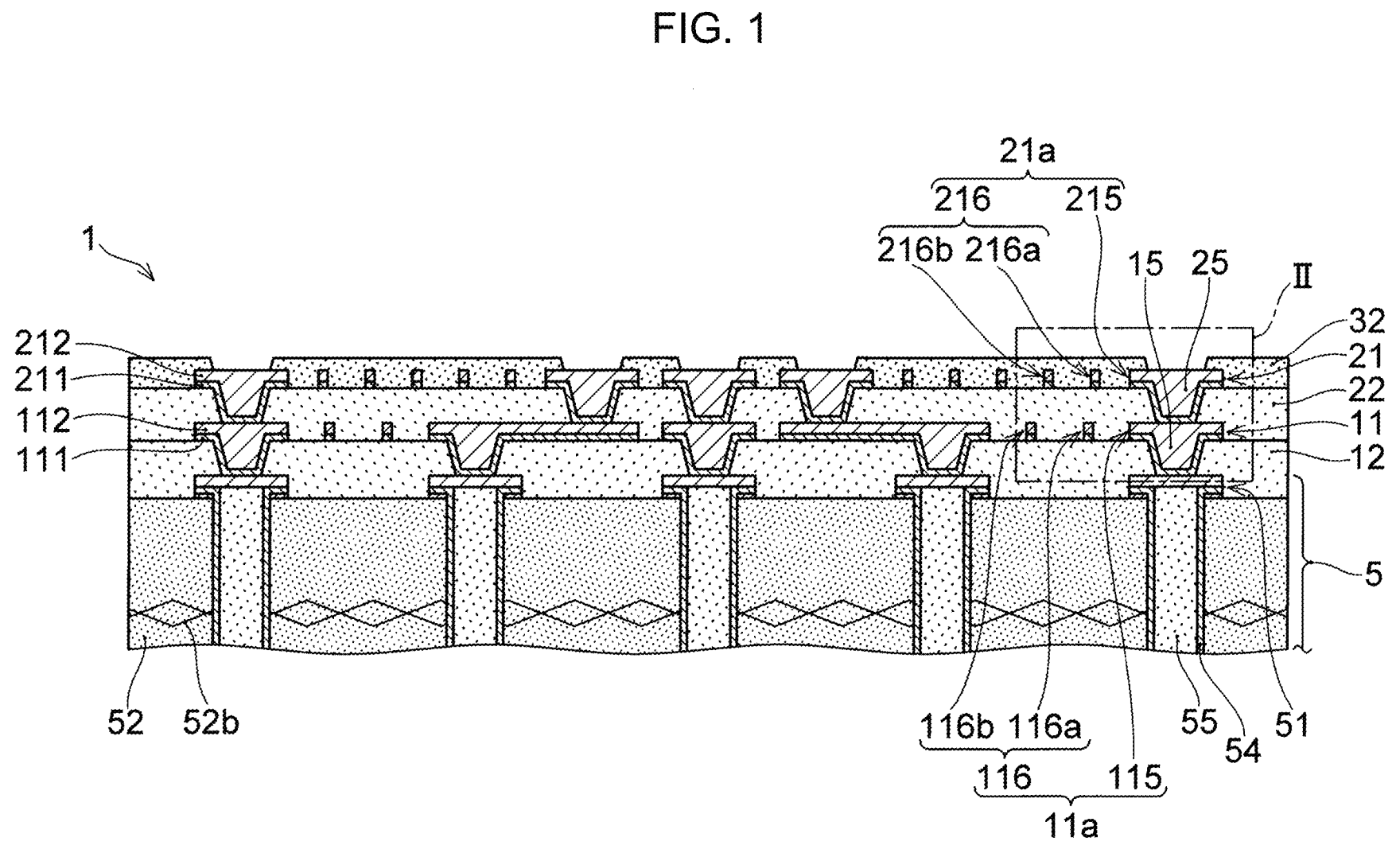

FIG. 1 is a cross-sectional view illustrating a wiring substrate 1, which is an example of a wiring substrate according to an embodiment of the present invention. The wiring substrate 1 is merely an example of the wiring substrate of the present embodiment. A laminated structure, and the number of conductor layers and the number of insulating layers, of the wiring substrate of the embodiment are not limited to the laminated structure of the wiring substrate 1 of FIG. 1, and the number of conductor layers and the number of insulating layers included in the wiring substrate 1.

As illustrated in FIG. 1, the wiring substrate 1 can include: a core substrate 5; an insulating layer (first insulating layer) 12 that is laminated on the core substrate 5; a conductor layer (first conductor layer) 11 that is formed on the insulating layer 12; an insulating layer (second insulating layer) 22 that covers the insulating layer 12 not covered by the conductor layer 11 and covers a surface of the conductor layer 11; a conductor layer (second conductor layer) 21 that is formed on the insulating layer 22; and an insulating layer (third insulating layer) 32 that covers the insulating layer 22 not covered by the conductor layer 21 and covers a surface of the conductor layer 21. In the wiring substrate 1 of the embodiment, the insulating layer 32 can be a solder resist layer. Although not illustrated in the drawings, the wiring substrate 1 can include any number of conductor layers containing any conductor patterns and any number of insulating layers laminated or formed on a surface on the opposite side with respect to a surface on one side of an insulating layer 52.

As illustrated in FIG. 1, the core substrate 5 includes the insulating layer (core insulating layer) 52 and a conductor layer (core conductor layer) 51 formed on the surface on the one side of the insulating layer 52. Further, the core substrate 5 includes a through-hole conductor 54 penetrating the insulating layer 52, and can also include, on the other surface (not illustrated in the drawings) of the insulating layer 52, a conductor layer (not illustrated in the drawings) similar to the conductor layer 51. The conductor layer 51 is connected to the conductor layer on the other surface of the insulating layer 52 by the through-hole conductor 54. An inner side of the through-hole conductor 54 can be filled with a resin body 55 containing an epoxy resin or the like. The conductor layer 51 can include any conductor pattern. In the example of FIG. 1, the conductor layer 51 has a multilayer structure including a lower layer formed of a metal foil provided on the insulating layer 52, a middle layer integrally formed with the through-hole conductor 54, and an upper layer covering the resin body 55. The conductor layer 51 may have a single-layer structure, or may have a multi-layer structure other than a three-layer structure including a lower layer, a middle layer, and an upper layer.

In the description of the embodiment, a side farther from the core substrate 5 (insulating layer 52) in a thickness direction (lamination direction) of the wiring substrate 1 is also referred to as an "outer side," an "upper side," or simply "upper," and a side closer to the core substrate 5 (insulating layer 52) is also referred to as an "inner side," a "lower side," or simply "lower." Further, for the conductor layers and the insulating layers, a surface facing the opposite side with respect to the core substrate 5 (insulating layer 52) is also referred to as an "upper surface," and a surface facing the insulating layer 52 side is also referred to as a "lower surface."

Each of the conductor layers (11, 21) also may include any conductor pattern. In the example of FIG. 1, the conductor layer (first conductor layer) 11 includes a conductor pattern (first conductor pattern) (11a). The conductor pattern (11a) can include a via land (first via land) 115 and a wiring pattern (first wiring pattern) 116. The wiring pattern 116 can include a wiring (first wiring of the first wiring pattern) (116a) and a wiring (second wiring of the first wiring pattern) (116b), which are adjacent to each other. Further, in the example of FIG. 1, the conductor layer (second conductor layer) 21 includes a conductor pattern (second conductor pattern) (21a). The conductor pattern (21a) can include a via land (second via land) 215 and a wiring pattern (second wiring pattern) 216. The wiring pattern 216 can include a wiring (first wiring of the second wiring pattern) (216a) and a wiring (second wiring of the second wiring pattern) (216b), which are adjacent to each other. In the example of FIG. 1, each of the conductor layers (11, 21) is formed to have a two-layer structure. However, each of the conductor layers (11, 21) may have a single-layer structure or a multi-layer structure of three or more layers. In the wiring substrate 1 of the embodiment, the via land 215 can be a conductor pad for connecting the wiring substrate 1 to an external component.

In the wiring substrate 1 of the embodiment, as will be described later, an upper surface of the wiring pattern 116 can be formed of a polished surface. Therefore, it is thought that the upper surface of the wiring pattern 116 has a higher level of flatness compared to a side surface of the wiring pattern 116. Such a structure of the wiring substrate 1 of the embodiment for improving adhesion between the upper surface of the wiring pattern 116 and the insulating layer 22 is described in detail below with reference to FIG. 2. FIG. 2 is an enlarged view of a region (II) surrounded by a one-dot chain line in FIG. 1. As illustrated in FIG. 2, in the wiring substrate 1 of the embodiment, the surface of the wiring pattern 116 can be covered with an organic coating film (first organic coating film) 23. The organic coating film 23 is selected, for example, from materials having a higher adhesive strength to the insulating layer 22 than to the wiring pattern 116. It is thought that by covering the surface of the wiring pattern 116 with such an organic coating film 23, the adhesion strength between the wiring pattern 116 and the insulating layer 22 is increased compared to a case where the insulating layer 22 is directly formed on the surface of the wiring pattern 116. An example of the material for the organic coating film 23 is a silane coupling agent containing an azole silane compound such as a triazole compound. As illustrated in FIG. 2, the adhesion strength between the wiring pattern 116 and the insulating layer 22 may be increased by forming unevenness on a surface of the organic coating film 23 facing the opposite side with respect to the wiring pattern 116. As a degree of the unevenness of the surface of the organic coating film 23, for example, a root mean square height of the surface of the organic coating film is 0.010 μm or more and 0.100 μm or less, and more preferably 0.030 μm or more and 0.070 μm or less. Specifically, in the example of FIG. 2, the upper and side surfaces of the wiring pattern 116 are covered with the organic coating film 23. Further, an upper surface of the insulating layer 12 where the wiring pattern 116 is not formed (that is, an exposed surface of the insulating layer 12) also may be covered with the organic coating film 23.

Similar to the upper surface of the wiring pattern 116, an upper surface of the wiring pattern 216 also can be formed of a polished surface. As illustrated in FIG. 2, a surface of the wiring pattern 216 also can be covered with an organic coating film (second organic coating film) 33. For example, the organic coating film 33 has the same arrangement, material, and form as those of the organic coating film 23.

As illustrated in FIG. 2, a via conductor (first via conductor) 15 connecting the conductor layer 51 and the conductor layer 11 can be formed. The via conductor 15 can be integrally formed with the via land 115. Further, a via conductor (second via conductor) 25 connecting the conductor layer 21 and the conductor layer 11 can be formed. The via conductor 25 also can be integrally formed with the via land 215.

In the wiring substrate 1 of the embodiment, for example, first, a through hole (first through hole) (12a) exposing at least a part of the upper surface of the conductor layer 51 can be formed at a formation position of the via conductor 15 in the insulating layer 12 by irradiating, for example, $CO_2$ laser from the upper surface side of the insulating layer 12. After that, the via conductor 15 can be formed in the through hole (12a). The through hole (12a) is formed, for example, such that an aspect ratio of the via conductor 15 ((height from the upper surface of the insulating layer 12 to a bottom surface of through hole (12a))/(diameter of the through hole (12a) at the upper surface of the insulating layer 12)) is about 0.5 or more and about 1.0 or less.

Similar to the formation of the via conductor 15, when the via conductor 25 is formed, a through hole (second through hole) (22a) exposing at least a part of an upper surface of the via land 115 can be formed. The through hole (22a) can be formed using the same method as the through hole (12a).

As illustrated in FIG. 2, the conductor layer 11 can include a lower layer 111 formed on the upper surface of the insulating layer 12 and an upper layer 112 formed on an upper surface of the lower layer 111. For example, to form the lower layer 111 of the conductor layer 11, a metal film (111a) (see FIG. 3B) forming the lower layer 111 of the conductor layer 11 is formed on an inner wall surface of the through hole (12a) and the upper surface of the insulating layer 12 by, for example, sputtering.

As illustrated in FIG. 2, similar to the conductor layer 11, the conductor layer 21 can include a lower layer 211 formed on the upper surface of the insulating layer 22 and an upper layer 212 formed on an upper surface of the lower layer 211. The conductor layer 21 can be formed using the same method as the conductor layer 11.

To form the upper layer 112 of the conductor layer 11, a plating resist (first plating resist) (R1) (see FIG. 3C) having openings (R11) corresponding to the conductor pattern (11a) included in the conductor layer 11 can be provided on an upper surface of the metal film (111a) (see FIG. 3B), for example, by lamination of a dry film resist and exposure and development. After that, the upper layer 112 of the conductor layer 11 illustrated in FIG. 2 can be formed by filling the openings (R11) of the plating resist (R1) with an electrolytic plating film (112a) (FIG. 3D) using the metal film (111a) as a seed layer.

Figure 3A:
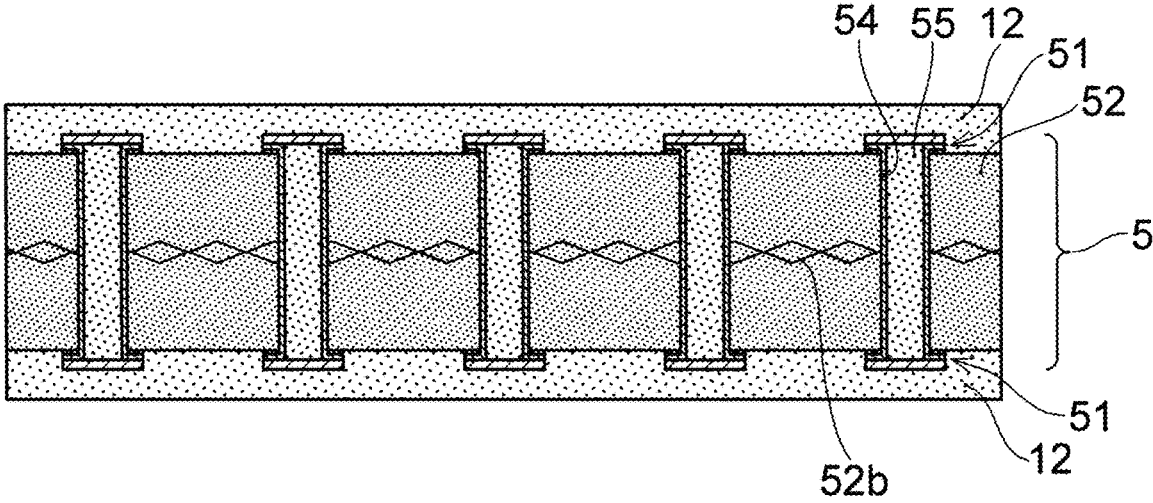
FIG. 3A is a cross-sectional view illustrating an example of a manufacturing process of a wiring substrate according to an embodiment of the present invention.
Figure 3B:
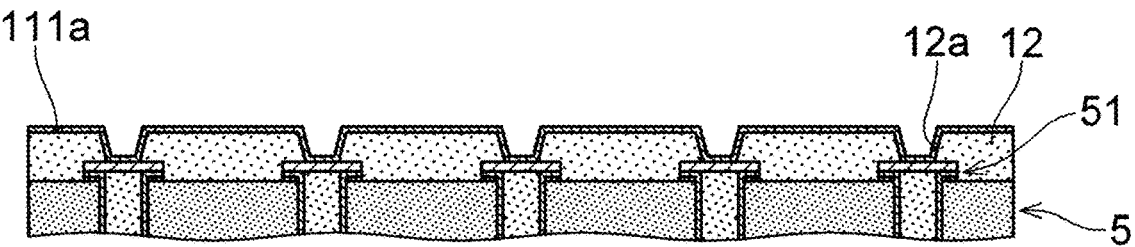
FIG. 3B is a cross-sectional view illustrating an example of a manufacturing process of a wiring substrate after FIG. 3A.
Figure 3C:
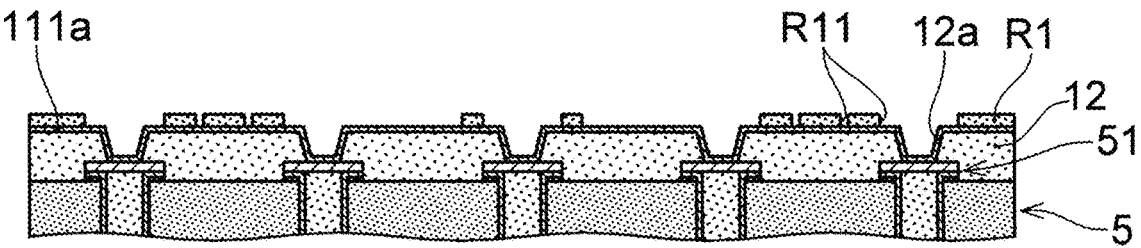
FIG. 3C is a cross-sectional view illustrating an example of a manufacturing process of a wiring substrate after FIG. 3B.
Figure 3D:
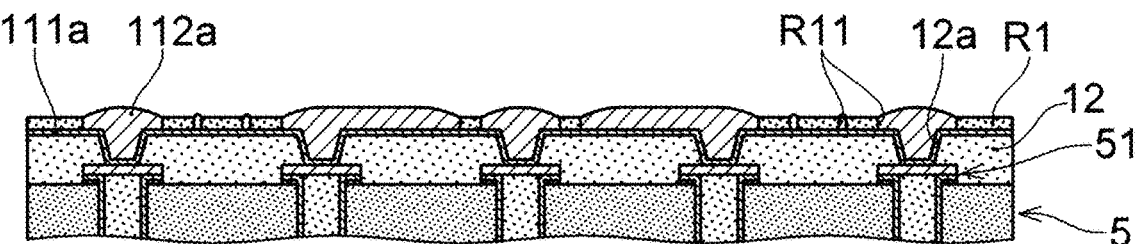
FIG. 3D is a cross-sectional view illustrating an example of a manufacturing process of a wiring substrate after FIG. 3C.
Figure 3E:
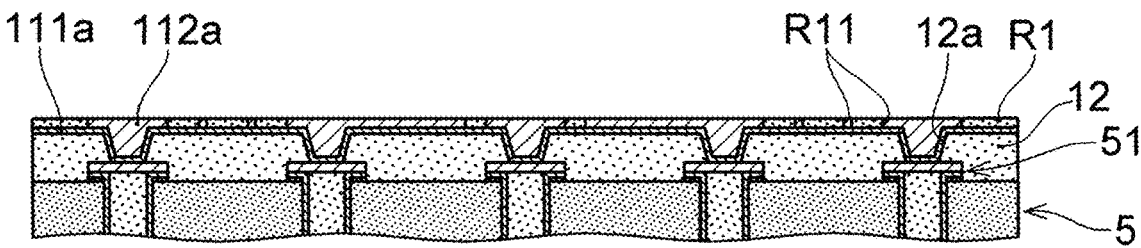
FIG. 3E is a cross-sectional view illustrating an example of a manufacturing process of a wiring substrate after FIG. 3D.
Figure 3F:
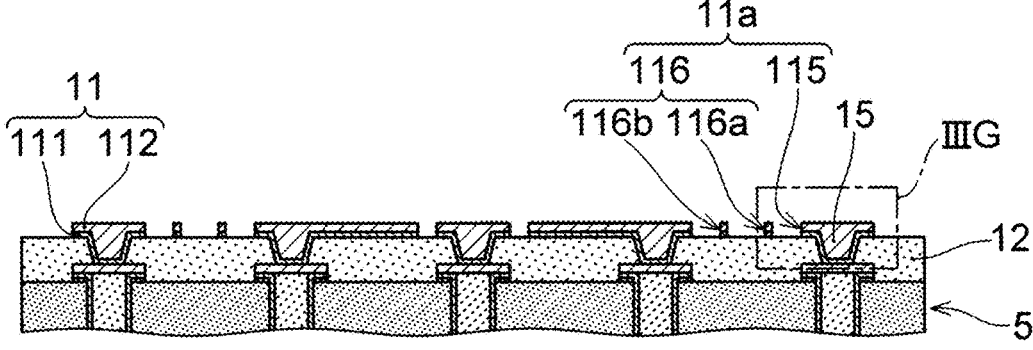
FIG. 3F is a cross-sectional view illustrating an example of a manufacturing process of a wiring substrate after FIG. 3E.
Figure 3G:
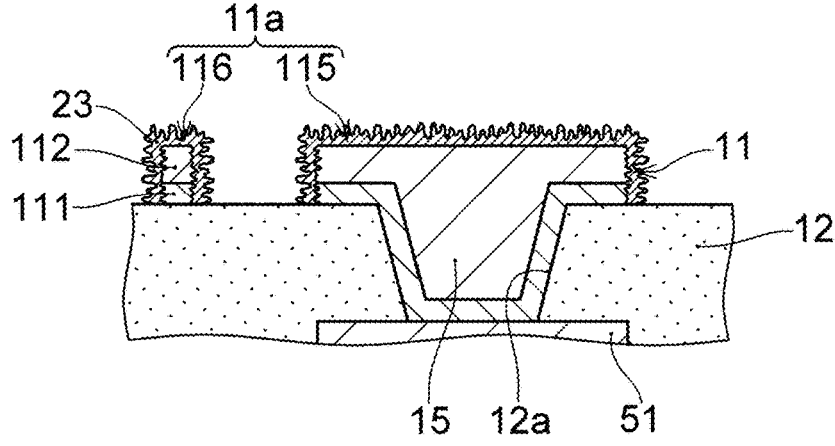
FIG. 3G is a partial enlarged view illustrating in detail a manufacturing process of a wiring substrate after FIG. 3F.
Figure 3H:
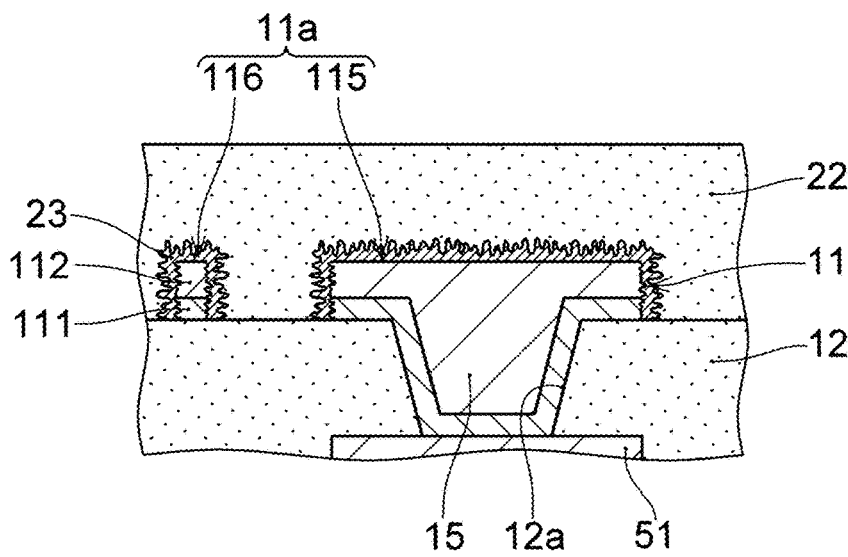
FIG. 3H is a partial enlarged view illustrating in detail a manufacturing process of a wiring substrate after FIG. 3G.
Figure 3I:
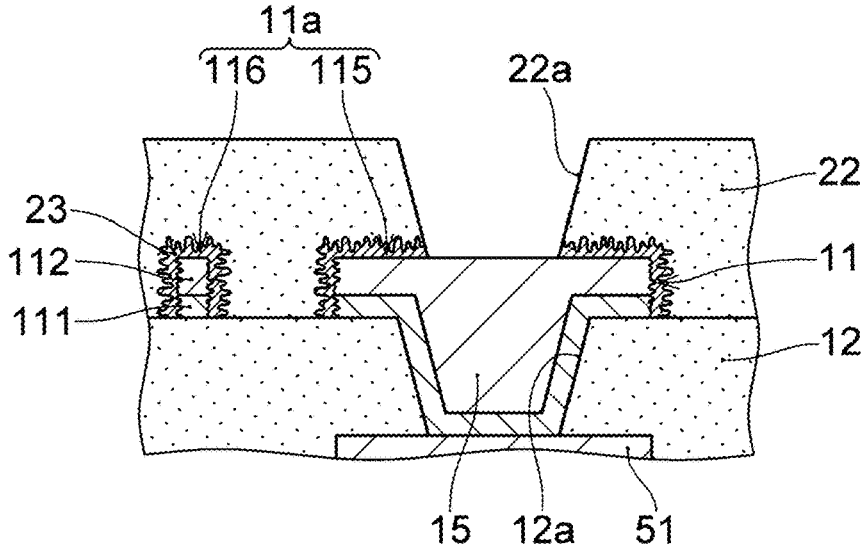
FIG. 3I is a partial enlarged view illustrating in detail a manufacturing process of a wiring substrate after FIG. 3H.
Figure 3J:
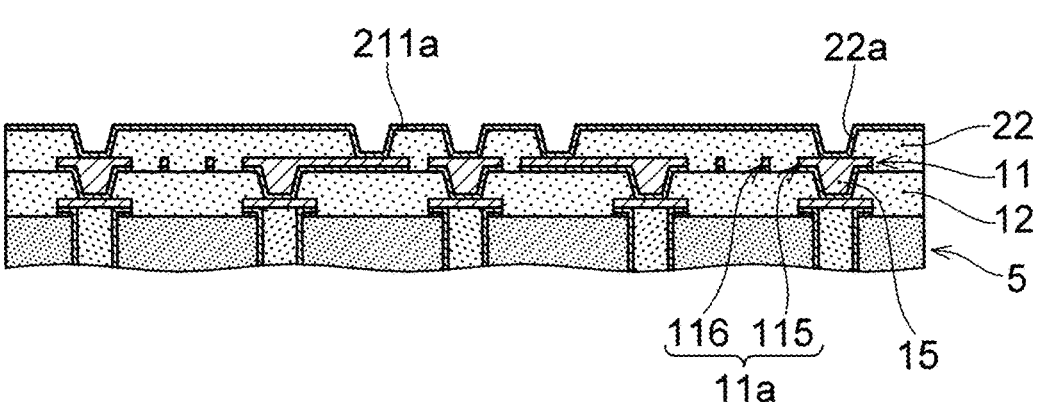
FIG. 3J is a cross-sectional view illustrating an example of a manufacturing process of a wiring substrate after FIG. 3I.
Figure 3K:
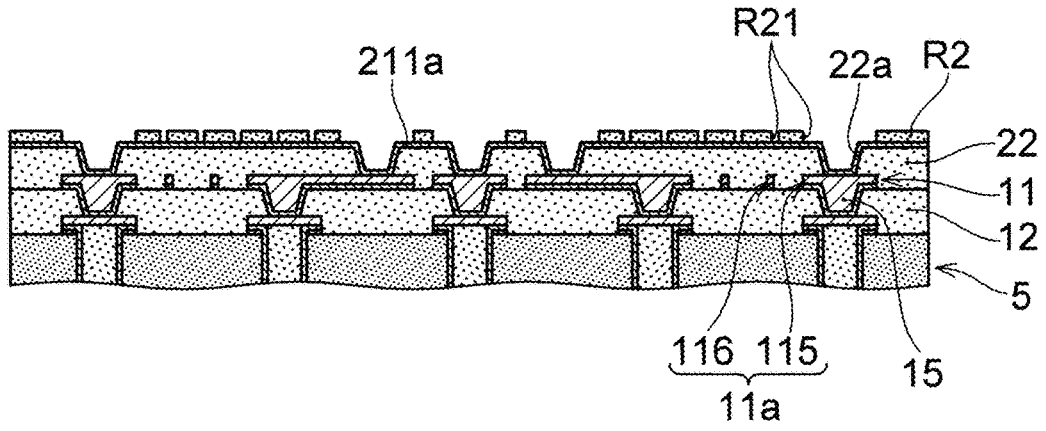
FIG. 3K is a cross-sectional view illustrating an example of a manufacturing process of a wiring substrate after FIG. 3J.
Figure 3L:
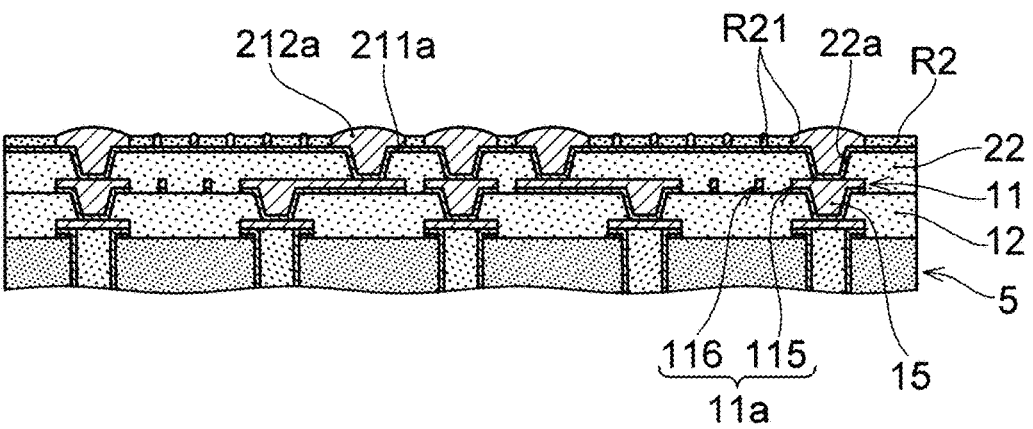
FIG. 3L is a cross-sectional view illustrating an example of a manufacturing process of a wiring substrate after FIG. 3K.

The upper layer 212 of the conductor layer 21 also can be formed using the same method as the upper layer 112 of the conductor layer 11 (see FIGS. 3J-3L).

As illustrated in FIG. 2, the wiring pattern 116 can include wirings (the first wiring (116a) and the second wiring (116b) of the first wiring pattern 116) having relatively small wiring widths and high aspect ratios. For example, the wiring widths of the first wiring (116a) and the second wiring (116b) in the wiring pattern 116 are 5 μm or less. A distance between the first wiring (116a) and the second wiring (116b) in the wiring pattern 116 is 7 μm or less. Specifically, for example, the wiring widths of the first wiring (116a) and the second wiring (116b) are about 1 μm or more and about 5 μm or less. On the other hand, for example, wiring widths of wirings other than the first wiring (116a) and the second wiring (116b) in the wiring pattern 116 are 7 μm or more.

As illustrated in FIG. 2, similar to the wiring pattern 116, the wiring pattern 216 can include wirings (the first wiring (216a) and the second wiring (216b) of the second wiring pattern 216) having relatively small wiring widths and high aspect ratios. A distance between the first wiring (216a) and the second wiring (216b), the wiring widths of the first wiring (216a) and the second wiring (216b), and wiring widths of wirings other than the first wiring (216a) and the second wiring (216b) also can be similar to those of the conductor layer 11.

Since the wiring substrate 1 has the wiring pattern 116, it may be possible to provide wirings that have a more suitable characteristic impedance for an electrical signal that can be transmitted. Further, it is thought that it may be possible to improve a wiring density and to further improve a degree of freedom in wiring design. From the same point of view, aspect ratios of wirings such as the first wiring (116a) or the second wiring (116b) in the wiring pattern 116 can be formed larger than aspect ratios of other wirings in the wiring pattern 116. For example, the aspect ratios of the wirings such as the first wiring (116a) or the second wiring (116b) in the wiring pattern 116 are preferably about 2.0 or more and about 4.0 or less. On the other hand, for example, the aspect ratios of the wirings other than the first wiring (116a) and the second wiring (116b) in the wiring pattern 116 can be about 1.5 or more and about 3.0 or less.

The aspect ratios of the first wiring (216a) and the second wiring (216b) in the wiring pattern 216, and the aspect ratios of the wirings other than the first wiring (216a) and the second wiring (216b) also can be similar to those of the wiring pattern 116.

To form a wiring conductor having such a small wiring width and a high aspect ratio, a deep opening is formed in the plating resist with high accuracy for forming the upper layer in the wiring pattern 116. Further, to prevent a defect such as a short circuit between wirings of the wiring pattern 116, side walls of the openings are formed substantially perpendicular to a planar direction of the wiring substrate 1 (a direction perpendicular to a thickness direction of the wiring substrate 1). However, when a thick plating resist is used as the aspect ratios of the wirings of the wiring pattern 116 increase, even when an exposure condition and the like are adjusted, it can be difficult to form openings corresponding to the wirings of the wiring pattern 116 in the plating resist in appropriate shapes by exposure and development. In particular, as the side walls of the openings become higher, it is thought that there is a risk that side walls of the plating resist forming the openings may have a skirt shape that widens in a tapered manner toward a surface of a power feeding layer (seed layer).

To form the upper layer 112 of the wiring pattern 116 having a two-layer structure on the lower layer 111, an electrolytic plating film forming the upper layer 112 can be formed on the upper surface of the metal film (111a) (see FIG. 3B) in the openings by electrolytic plating using the metal film (111a) as a power feeding layer (seed layer). That is, the openings of the plating resist can be filled with the electrolytic plating film. Therefore, when an opening is formed such that a side wall of the plating resist has, for example, a skirt shape or the like, there is a possibility that a wiring included in the wiring pattern 116 cannot be formed with a uniform wiring width. Further, in filling the openings of the plating resist with the electrolytic plating film, the openings are usually not completely filled. According to a general method for forming a wiring conductor, a plating resist is formed thicker than a wiring conductor. That is, when a wiring has a high aspect ratio, an opening of a plating resist is formed with an aspect ratio that is even higher than that of the wiring. It is thought that the above-described problem related to the shape of the side wall of the opening is more likely to occur.

In the wiring substrate 1 of the embodiment, since the wiring pattern 216 also can be formed in the same manner as the wiring pattern 116, it is thought that the same considerations can be applied to the wiring pattern 216 as well.

In the wiring substrate 1 of the embodiment, the electrolytic plating film (112a) formed by electrolytic plating using the metal film (111a) as a power feeding layer (seed layer) can be formed thicker than the plating resist (R1) (see FIG. 3D). In this case, it is not necessary to form a thick plating resist (R1) and provide deep openings (R11) in the plating resist (R1). Further, since the plating resist (R1) does not become thick, the openings (R11) having appropriate shapes such that the side walls of the openings (R11) are substantially perpendicular to the planar direction of the wiring substrate 1 can be formed. By filling such openings (R11) with the electrolytic plating film (112a), the conductor pattern (11a) of the conductor layer 11, in particular, the upper layer 112 of the wiring pattern 116, is formed. Therefore, it is thought that the wiring pattern 116 including the wirings (116a, 116b) having high aspect ratios is formed with high accuracy. The side walls of the wirings (116a, 116b) included in the wiring pattern 116 are formed along the substantially vertical side walls of the openings (R11) and thus are substantially perpendicular to the planar direction of the wiring substrate 1. Therefore, it is thought that there is no risk of causing a defect such as a short circuit between the wirings (116a, 116b) of the wiring pattern 116. For example, the electrolytic plating film (112a) can be formed 1 μm or thicker than the plating resist (R1). The electrolytic plating film (112a) can completely fill the through hole (12a) of the insulating layer 12. As a result, as illustrated in FIG. 2, the via land 115 can be integrally formed with the via conductor 15.

Similar to the electrolytic plating film (112a), an electrolytic plating film (212a) formed by electrolytic plating using a metal film (211a) as a power feeding layer (seed layer) also can be formed thicker than a plating resist (R2) (see FIG. 3L). As a result, as illustrated in FIG. 2, the via land 215 can be integrally formed with the via conductor 25.

After that, a part of the electrolytic plating film (112a) in the thickness direction is removed by polishing (see FIG. 3E). For example, a part of the electrolytic plating film (112a1a) can be removed by chemical mechanical polishing (CMP) or sandblasting or the like. By the polishing, a part of the plating resist (R1) in the thickness direction also can be removed. Specifically, the electrolytic plating film (112a) is polished together with the plating resist (R1) until a predetermined thickness required for the upper layer 112 of the conductor layer 11 is reached. Therefore, after the formation of the electrolytic plating film (112a), for example, even when the surface is uneven as illustrated in FIG. 3D, the upper surface of the upper layer 112 of the conductor layer 11 that has been subjected to polishing can be flattened. Therefore, it is thought that adjustment of the thickness of the upper layer 112 of the conductor layer 11 also is easy. Further, when the upper surface of the conductor layer 11 is a flattened polished surface with less unevenness, it is thought that, in the wiring pattern 116, good high-frequency transmission characteristics can be obtained.

As illustrated in FIG. 2, since the upper surface of the via land 115 integrally formed with the via conductor 15 is a highly flat polished surface, when the via conductor 25 formed so as to overlap the via conductor 15 in a plan view, it is thought that good connectivity between the via conductor 15 and the via conductor 25 can be provided. That the via conductor 15 and the via conductor 25 "overlap in a plan view" means that, when the wiring substrate 1 is viewed along the thickness direction, the lower surface of the via conductor 25 at least partially overlaps the upper surface of the via conductor 15. Further, since the entire upper surface of the conductor layer 11 is polished, the conductor layer 11 having a uniform thickness can be obtained regardless of the unevenness or density of the conductor layer 11. Further, in the manufacturing of the laminated structure of the wiring substrate 1, since occurrence of misalignment or the like is suppressed, it is thought that a wiring substrate 1 with high connection reliability can be provided. Further, it is thought that it is possible to reduce planar sizes of the via conductor and the via land 115 while maintaining high connection reliability. As a result, in the wiring substrate 1, for example, the via conductor 15 having relatively small diameter with an aspect ratio of about 0.5 or more and about 1.0 or less can be provided.

After that, the plating resist (R1) is removed, and a portion of the metal film (111a) that is not covered by the upper layer 112 is removed by etching or the like (see FIG. 3F). As a result, as illustrated in FIG. 2, the conductor layer 11 that includes the conductor pattern (11a) and has a two-layer structure including the lower layer 111 and the upper layer 112 can be obtained. Since the upper layer 112 of the conductor layer 11 can be formed without using a thick plating resist (R1), it is thought that the wirings (116a, 116b) having side walls substantially perpendicular to the planar direction and having high aspect ratios, which were conventionally difficult to obtain, are formed. As described above, the upper surface of the conductor layer 11 is a polished surface. Therefore, it is thought that the conductor layer 11, which includes the conductor pattern (11a), has excellent surface flatness.

Similar to the conductor layer 11, the conductor layer 21 also can be formed by polishing (see FIG. 3M), removing the plating resist (R2), and etching (see FIG. 3N), and thus, it is thought that good high-frequency transmission characteristics and high connection reliability can be obtained. Further, also in the conductor layer 21, it is thought that the wirings (216a, 216b) having high aspect ratios can be formed.

In the following, the wiring substrate 1 of the embodiment is further described in detail by referring to an example of a method for manufacturing the wiring substrate illustrated in FIGS. 3A-3Q. In FIG. 3A, conductor layers are formed on both sides of the core substrate 5, and also in FIGS. 3B-3Q illustrating subsequent processes, it is intended that conductor layers and insulating layers are sequentially formed on both sides of the core substrate 5. However, for convenience of description, in FIGS. 3B-3Q, only the formation of the conductor layers and insulating layers on one side of the core substrate 5 is illustrated. The number of the conductor layers and insulating layers formed on the other side may be the same as or different from the number of the conductor layers and insulating layers formed on the one side.

As illustrated in FIG. 3A, the core substrate 5 is prepared that includes the insulating layer 52 and the conductor layer 51 on both sides of the insulating layer 52, and the insulating layer 12 is formed on both sides of the core substrate 5.

The core substrate 5 is prepared, for example, as follows. First, a through hole for forming the through-hole conductor 54 is formed in a double-sided copper-clad laminate, and a metal film is formed on an inner wall surface of the through hole and on surfaces of the double-sided copper-clad laminate by electroless plating or sputtering, and electrolytic plating. The through-hole conductor 54 formed of a metal film integrated with the previously formed metal film is formed in the through hole. Next, an inner side of the through-hole conductor 54 is filled with the resin body 55, for example, by injecting an epoxy resin. Next, a metal film is further formed on surfaces of the previously formed metal film and the resin body 55 by electroless plating or electrolytic plating. Next, the conductor layer 51 of a multilayer structure having a predetermined conductor pattern is formed on both sides of the insulating layer 52 by patterning using a subtractive method. The core substrate 5 can be prepared by the above processes. After that, the insulating layer 12 is formed on both sides of the core substrate 5, for example, by thermocompression bonding a film-like epoxy resin.

The insulating layer 52 can contain any insulating resin. Examples of the insulating resin of the insulating layer 52 include: thermosetting resins such as epoxy resins, bismaleimide triazine resins (BT resins), or phenolic resins; and thermoplastic resins such as fluorine resins, liquid crystal polymers (LCP), fluoroethylene (PTFE) resins, polyester (PE) resins, and modified polyimide (MPI) resins. The insulating layer 52 may contain a core material (reinforcing material) formed of a glass fiber or an aramid fiber. In one example of the wiring substrate 1 of the embodiment, the insulating layer 52 contains a core material (52b). The insulating layer 52 may contain an inorganic filler (not illustrated in the drawings) formed of fine particles of silica ($SiO_2$), alumina, mullite, or the like. When the insulating layer 52 contains an inorganic filler, for example, the insulating layer 52 can have a thermal expansion coefficient close to that of the conductor layers (51, 11, 21) (see FIGS. 1 and 2), and thus, it is preferable.

Next, as illustrated in FIG. 3B, the insulating layer 12 is laminated on the surface of the core substrate 5, the through hole (12a) is formed at the formation position of the via conductor 15 (see FIGS. 1 and 2) in the insulating layer 12, and the metal film (111a) is formed on the inner wall surface of the through hole (12a) and the upper surface of the insulating layer 12.

The insulating layer 12 is formed, for example, by laminating and thermocompression bonding a film-like epoxy resin on the surface of the core substrate 5. The through hole (12a) is formed, for example, by irradiating laser such as $CO_2$ laser. The insulating layer 12 may contain the same insulating resin as the insulating layer 52 or a different insulating resin from the insulating layer 52. As in the wiring substrate 1 of the embodiment, when a conductor pattern including a wiring pattern in which wirings can be formed at a fine pitch is formed in a conductor layer, it may be preferable that via conductors also are formed at a fine pitch. In this case, it may be preferable that the through hole (12a) for a via conductor having a small diameter is formed in the insulating layer 12. Therefore, to facilitate the formation of the through hole (12a) having a small diameter, an insulating layer 12 that does not contain an inorganic filler may be preferable. However, similar to the insulating layer 52, from a point of view of the thermal expansion coefficient, it may be preferable for the insulating layer 12 to contain a core material or an inorganic filler.

The through hole (12a) is formed, for example, by irradiating laser such as $CO_2$ laser. Although not illustrated, the formation of the through hole (12a) by irradiating laser such as $CO_2$ laser can be performed by irradiating laser while protecting the surface of the insulating layer 12 with a protective film such as a polyethylene terephthalate (PET) film. Further, after the formation of the through hole (12a), a desmear treatment may be performed to prevent a decrease in adhesion or an increase in a resistance component or the like during the formation of the conductor layer 11 (see FIGS. 1 and 2) due to a processing-modified substance occurring at a lower surface of the through hole (12a). Preferably, the desmear treatment can be a dry desmear treatment using plasma. The desmear treatment also may be performed while the surface of the insulating layer 12 is protected with a protective film such as a polyethylene terephthalate (PET) film. When the insulating layer 12 is formed using a photosensitive resin, the through hole (12a) may be formed by exposure and development using an exposure mask having an opening corresponding to the through hole (12a).

The metal film (111a) is formed of, for example, copper or nickel or the like, and can be formed by electroless plating or sputtering.

Next, as illustrated in FIG. 3C, the plating resist (R1) having the openings (R11) corresponding to the conductor pattern (11a) (see FIGS. 1 and 2) included in the conductor layer 11 is provided on the upper surface of the metal film (111a).

The plating resist (R1) is provided, for example, by lamination of a dry film resist and exposure and development or the like.

Next, as illustrated in FIG. 3D, on the upper surface of the metal film (111a) exposed by the openings (R11), the electrolytic plating film (112a) is formed higher than the plating resist (R1).

The electrolytic plating film (112a) is formed of, for example, copper or nickel or the like, and can be formed by electrolytic plating using the metal film (111a) as a power feeding layer (seed layer). The electrolytic plating film (112a) is formed higher than the upper surface of the plating resist (R1), for example, forming a convex spherical shape. For example, the plating resist (R1) can be formed to have a thickness of about 7 μm or more and 25 μm or less. Preferably, the height of the highest part of the electrolytic plating film (112a) (the height of the apex of the convex spherical shape) is 1 μm or higher than the height of the plating resist (R1).

Next, as illustrated in FIG. 3E, the electrolytic plating film (211a) and the plating resist (R1) are partially removed by polishing.

The polishing is performed such that the upper surface of the conductor layer 11 has a higher flatness than the side surface (see FIG. 2), for example, until the thickness of the electrolytic plating film (112a) reaches a predetermined thickness required for the upper layer 112 of the conductor layer 11 (see FIGS. 1 and 2). The thickness of the conductor layer 11 is, for example, 7 μm or more. The thickness of the upper layer 112 of the two-layer structure of the conductor layer 11 is, for example, 6.5 μm or more.

Next, after the plating resist (R1) is removed, a portion of the metal film (111a) that is not covered by the electrolytic plating film (112a) is removed by etching or the like. Thereby, as illustrated in FIG. 3F, the conductor layer 11 including conductor pattern (11a) having a two-layer structure including the lower layer 111 and the upper layer 112 can be formed. As a result, in the conductor pattern (11a), the via land 115 connected to the via conductor 15, and the wiring pattern 116 including the first wiring (116a) and the second wiring (116b), which have high aspect ratios, can be formed.

After that, in the method for manufacturing the wiring substrate 1 of the embodiment, the organic coating film 23 that improves the adhesion between the wiring pattern 116, of which the upper surface is formed by polishing, and the insulating layer 22 to be formed in a subsequent process is provided (see FIGS. 1 and 2). In the following, processes after FIG. 3F are described in more detail with reference to FIGS. 3G-3I, which are enlarged views of a region (IIIG) enclosed by a one-dot chain line in FIG. 3F.

As illustrated in FIG. 3G, the organic coating film 23 can be provided so as to cover exposed surfaces (the upper surface and the side surface) of the wiring pattern 116. In the example of FIG. 3G, the organic coating film 23 covers entire exposed surfaces (the upper surface and the side surface) of the conductor layer 11, including exposed surfaces (the upper surface and the side surface) of the via land 115, of which the upper surface is formed by polishing, similar to the wiring pattern 116. In the example of FIG. 3G, the organic coating film 23 is patterned using any method so as to cover only the exposed surfaces of the wiring pattern 116 and also the exposed surfaces of the conductor layer 11, which includes the wiring pattern 116. However, it is also possible that the organic coating film 23 is provided so as to cover not only the exposed surfaces of the conductor layer 11 but also an exposed surface of the insulating layer 12 (in other words, an entire exposed surface on the upper surface side in FIG. 3A). It is also possible that the organic coating film 23 is provided so as to cover only the upper surface of the conductor layer 11.

The organic coating film 23 is formed, for example, by immersion of the wiring pattern 116 (or the entire conductor layer 11) in a liquid containing a material such as a silane coupling agent that can bind to both an organic material and inorganic material, or by spraying of such a liquid. However, a method for forming the organic coating film 23 is arbitrary and is not limited to immersion or spraying. Further, as described above, when it is desired to cause the surface of the organic coating film 23 facing the opposite side with respect to the wiring pattern 116 to have unevenness, the surface of the organic coating film 23 may be roughened. The unevenness of the surface of the organic coating film 23 can also be formed by selecting the material for the organic coating film 23 or changing a curing condition, or the like.

After that, in the method for manufacturing the wiring substrate 1 of the embodiment, as illustrated in FIG. 3H, the insulating layer 22 is laminated on the surfaces of the insulating layer 12 and the organic coating film 23, and as illustrated in FIG. 3I, the through hole (22a) is formed at the formation position of the via conductor 25 (see FIGS. 1 and 2) in the insulating layer 22. The through hole (22a) penetrates the insulating layer 22 and the organic coating film 23, and thereby, the upper surface of the via land 115 is exposed. The lamination of the insulating layer 22 and the formation of the through hole (22a) can be respectively performed in the same manner as the lamination of the insulating layer 12 and the formation of the through hole (12a).

Next, as illustrated in FIG. 3J, the metal film (211a) is formed on the inner wall surface of the through hole (22a) and the upper surface of the insulating layer 22, and as illustrated in FIG. 3K, the plating resist (R2) having openings (R21) corresponding to the conductor pattern (21a) included in the conductor layer 21 (see FIGS. 1 and 2) is provided on the surface of the metal film (211a). The metal film (211a) and the plating resist (R2) can be respectively formed in the same manner as the metal film (111a) and the plating resist (R1).

Figure 3M:
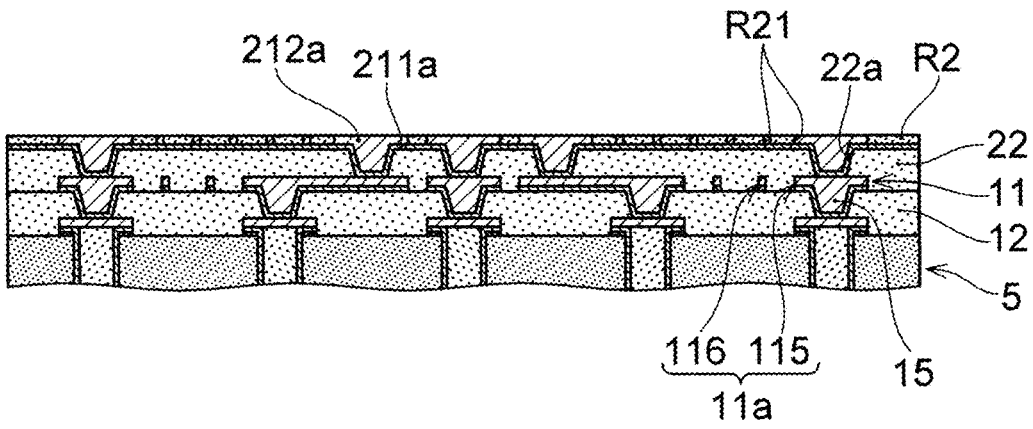
FIG. 3M is a cross-sectional view illustrating an example of a manufacturing process of a wiring substrate after FIG. 3L.

Next, as illustrated in FIG. 3L, on the surface of the metal film (211a) exposed by the openings (R21), the electrolytic plating film (212a) is formed higher than the upper surface of the plating resist (R2), and as illustrated in FIG. 3M, a part of the electrolytic plating film (212a) and a part of the plating resist (R2) in the thickness direction are removed by polishing. The formation of the electrolytic plating film (212a) and the polishing of the electrolytic plating film (212a) and the plating resist (R2) can be respectively performed in the same manner as the formation of the electrolytic plating film (112a) and the polishing of the electrolytic plating film (112a) and the plating resist (R1).

Figure 3N:
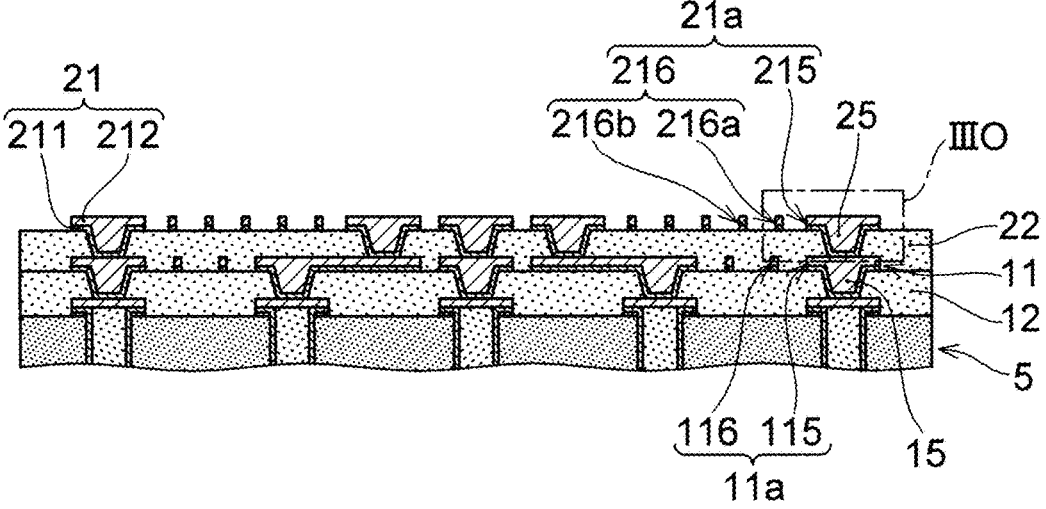
FIG. 3N is a cross-sectional view illustrating an example of a manufacturing process of a wiring substrate after FIG. 3M.

Next, after the plating resist (R2) is removed, a portion of the metal film (211a) that is not covered by the upper layer 212 is removed by etching or the like. Thereby, as illustrated in FIG. 3N, the conductor layer 21 including conductor pattern (21a) having a two-layer structure including the lower layer 211 and the upper layer 212 can be formed. As a result, in the conductor pattern (21a), the via land (conductor pad) 215 connected to the via conductor 25, and the wiring pattern 216 including the first wiring (216a) and the second wiring (216b), which have high aspect ratios, can be formed.

Figure 3O:
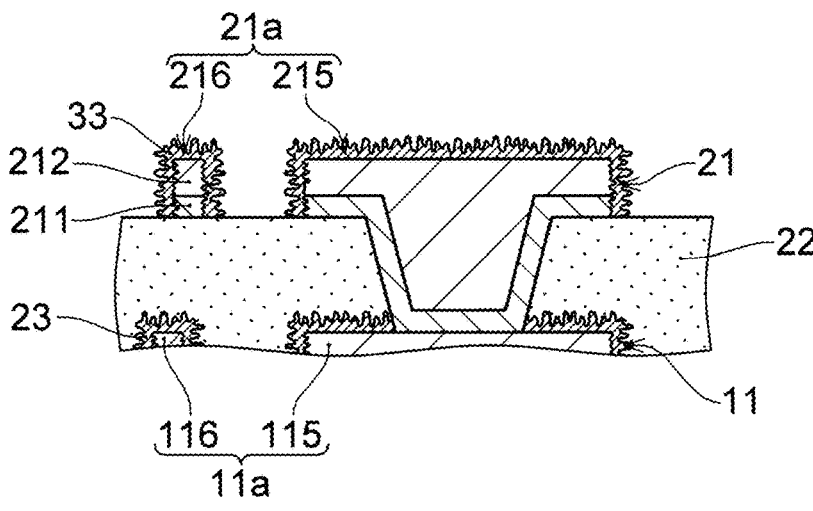
FIG. 3O is a partial enlarged view illustrating in detail a manufacturing process of a wiring substrate after FIG. 3N.
Figure 3P:
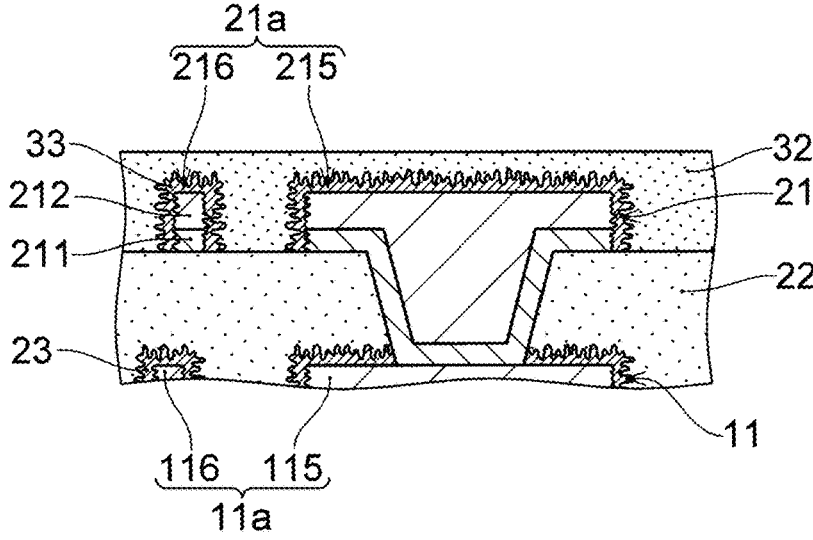
FIG. 3P is a partial enlarged view illustrating in detail a manufacturing process of a wiring substrate after FIG. 3O.
Figure 3Q:
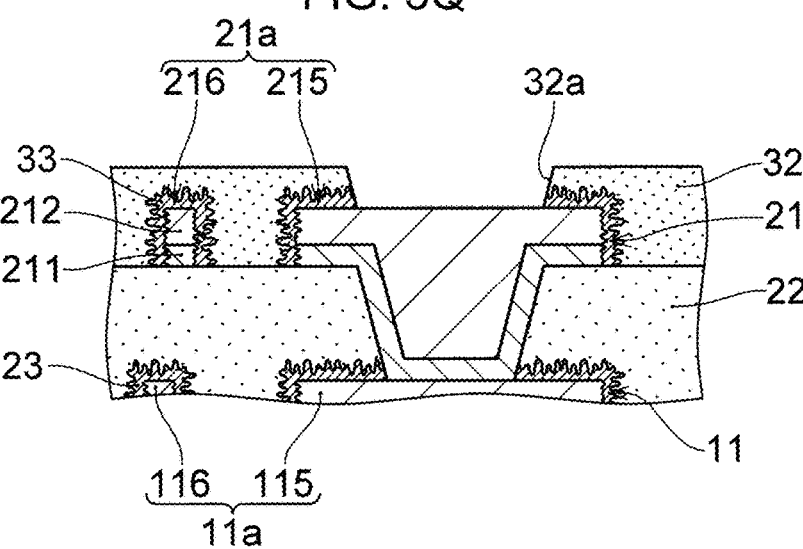
FIG. 3Q is a partial enlarged view illustrating in detail a manufacturing process of a wiring substrate after FIG. 3P.

After that, in the method for manufacturing the wiring substrate 1 of the embodiment, the organic coating film 33 that improves the adhesion between the wiring pattern 216, of which the upper surface is formed by polishing, and the insulating layer (solder resist layer) 32 to be formed in a subsequent process is provided (see FIGS. 1 and 2). FIGS. 3O-3Q are enlarged views of a region (IIIO) surrounded by a one-dot chain line in FIG. 3N.

As illustrated in FIG. 3O, the organic coating film 33 can be provided so as to cover exposed surfaces (the upper surface and the side surface) of the wiring pattern 216. After the formation of the organic coating film 33, as illustrated in FIG. 3P, the insulating layer 32 can be laminated on the surfaces of the insulating layer 22 and the organic coating film 33, and as illustrated in FIG. 3Q, a through hole (32a) can be formed in the insulating layer 32 at a connection position between the wiring substrate 1 and an external component. The formation of the organic coating film 33, the insulating layer 32, and the through hole (32a) can be performed in the same manner as the formation of the organic coating film 23, the insulating layer 22, and the through hole (22a) (see FIGS. 3G-3I).

Through the above processes, the wiring substrate 1 illustrated in FIGS. 1 and 2, having a multilayer wiring structure in which the wirings (116a, 116b, 216a, 216b) having high aspect ratios are included at fine pitches, is completed.

The wiring substrate 1 of the embodiment described above is not limited to those having the structures illustrated in the drawings and those having the structures, shapes, and materials exemplified in the present specification. For example, the wiring substrate may have any number of insulating layers and any number of conductor layers. Further, the wiring substrate is not limited to the mode of having a core substrate, and the wiring substrate of the embodiment may only have a structure that includes at least a conductor layer and insulating layers provided so as to sandwich the conductor layer therebetween.

Figure 4:
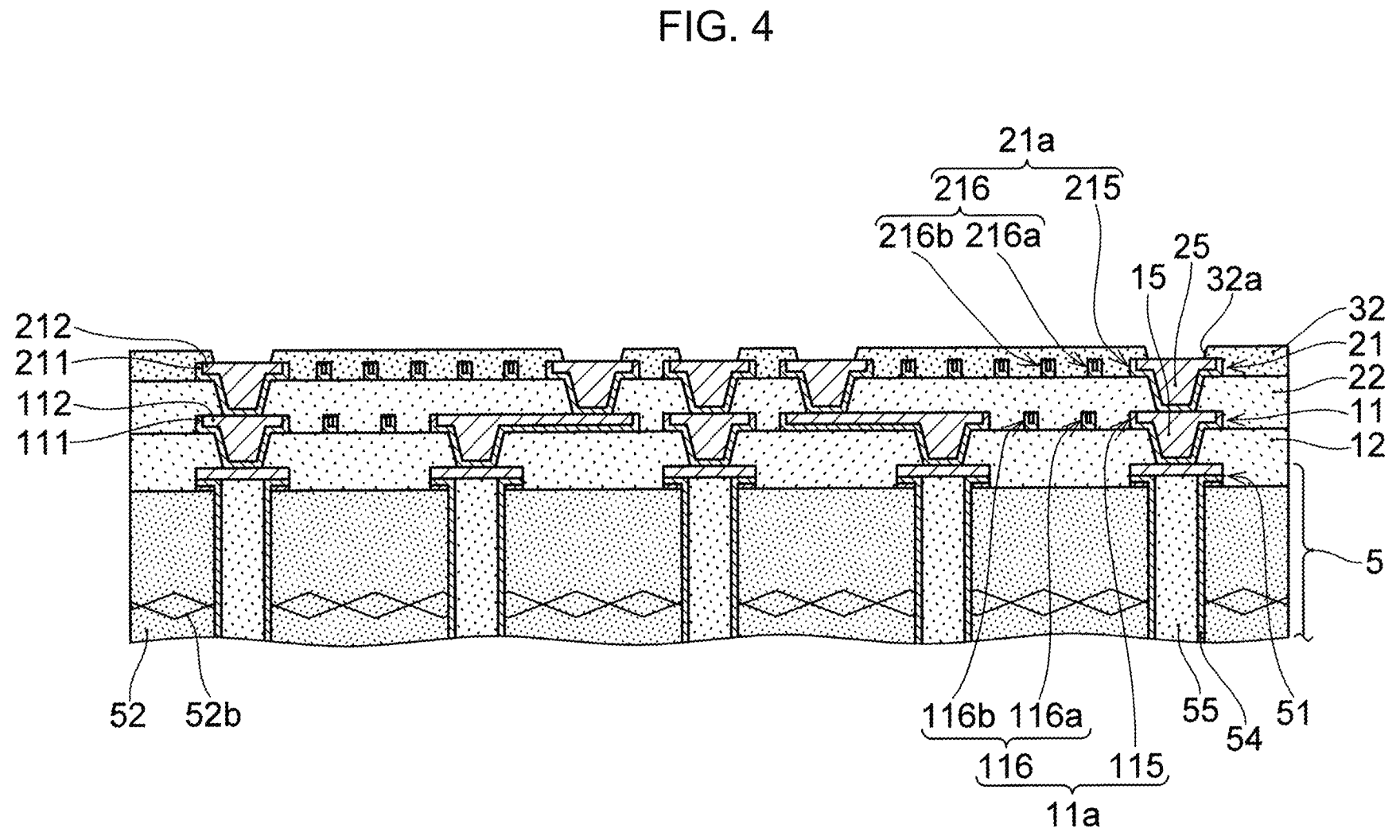

For example, in the above description of the embodiment, in the formation of the conductor layer (11, 21), the metal film (seed layer) (111a, 211a) is formed on the inner wall surface of the through hole (12a, 22a) and the entire upper surface of the insulating layer (12, 22), and the plating resist (R1, R2) having the openings (R11, R21) are provided on the upper surface thereof. However, it is also possible that the plating resist (R1, R2) is first provided on the surface of the insulating layer (12, 22), and after that, the metal film (seed layer) (111a, 211a) is formed on the inner wall surface of the through hole (12a, 22a) and on the upper surface of the insulating layer (12, 22) that is not covered by the plating resist (R1, R2) and on the upper surface of the plating resist (R1, R2) and on the inner wall surfaces of the openings (R11, R21) of the plating resist (R1, R2). An example of a wiring substrate 1 manufactured in this way is illustrated in FIG. 4, and an example of the manufacturing method of the wiring substrate 1 is illustrated in FIGS. 5A-5H. In FIGS. 4-5H, a structural element having the same function as in the embodiment described above is indicated using the same reference numeral symbol as in the embodiment described above. Further, in the following description, a detailed description of a structure that is the same as in the embodiment described above is omitted.

In one example of the wiring substrate 1 illustrated in FIG. 4, unlike the wiring substrate 1 of the embodiment described above, in each of the conductor layers (11, 21), the lower layer (111, 211) is formed so as to cover the side surface of the upper layer (112, 212).

Figure 5A:
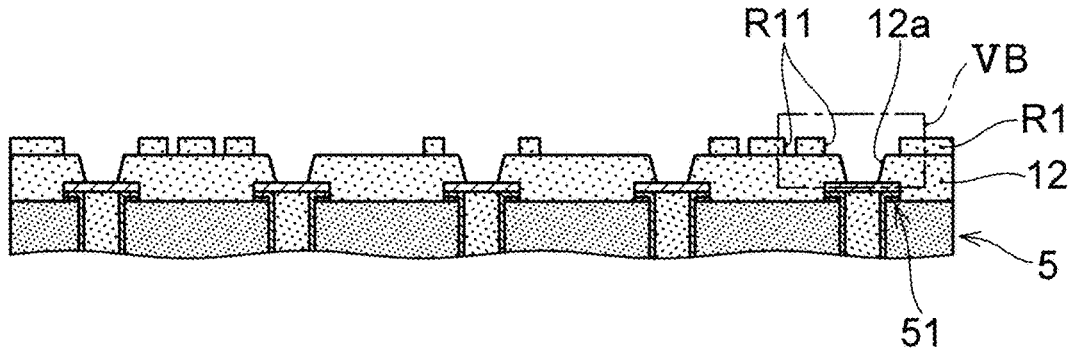
FIG. 5A is a cross-sectional view illustrating an example of a manufacturing process of a wiring substrate according to another embodiment of the present invention.
Figure 5B:
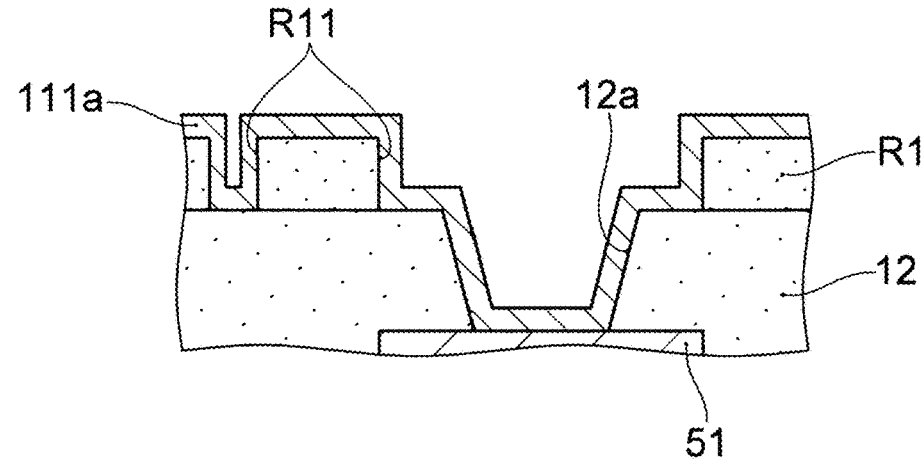
FIG. 5B is a partial enlarged view of VB in FIG. 5A illustrating in detail a manufacturing process of a wiring substrate of FIG. 5A.
Figure 5C:
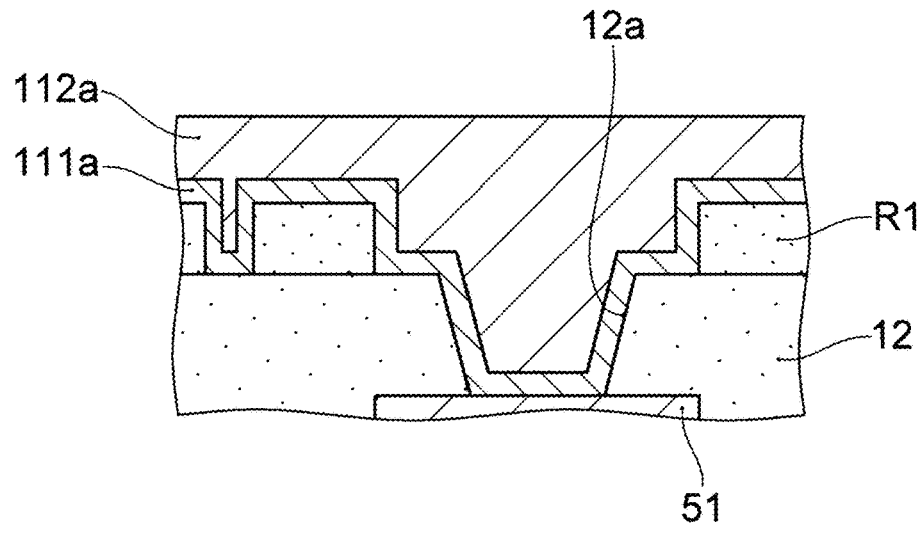
FIG. 5C is a partial enlarged view illustrating in detail a manufacturing process of a wiring substrate after FIG. 5B.
Figure 5D:
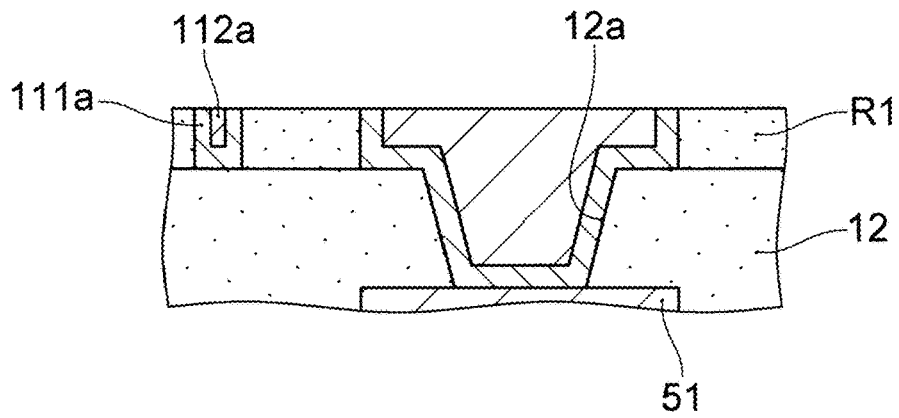
FIG. 5D is a partial enlarged view illustrating in detail a manufacturing process of a wiring substrate after FIG. 5C.

Regarding the formation of the conductor layer 11 (see FIG. 4), for example, as illustrated in FIG. 5A, first, the plating resist (R1) having the openings (R11) is provided on the upper surface of the insulating layer 12. Next, as illustrated in FIG. 5B, the metal film (111a) is formed by sputtering or the like on the inner wall surface of the through hole (12a), the upper surface of the insulating layer 12 that is not covered by the plating resist (R1), the upper surface of the plating resist (R1), and the inner wall surfaces of the openings (R11) of the plating resist (R1). Next, as illustrated in FIG. 5C, the electrolytic plating film (112a) is formed on the entire surface of the metal film (111a) by electrolytic plating using the metal film (111a) as a power feeding layer (seed layer). Next, as illustrated in FIG. 5D, by polishing, a portion of the electrolytic plating film (112a) in the thickness direction is removed together with at least a portion of the metal film (111a) on the upper surface of the plating resist (R1) and the plating resist (R1). Next, although not illustrated, the plating resist (R1) is removed from the upper surface of the insulating layer 12. Thereby, the conductor layer 11 including the conductor pattern (11a) having a two-layer structure including the lower layer 111 and the upper layer 112 can be formed (see FIG. 4). As a result, in the conductor pattern (11a), the via land 115 connected to the via conductor 15, and the wiring pattern 116 including the first wiring (116a) and the second wiring (116b), which have high aspect ratios, can be formed (see FIG. 4). After that, although not illustrated, the surface of the wiring pattern 116 is covered with the organic coating film 23 in the same manner as in the embodiment described above (see FIG. 3G).

Figure 5E:
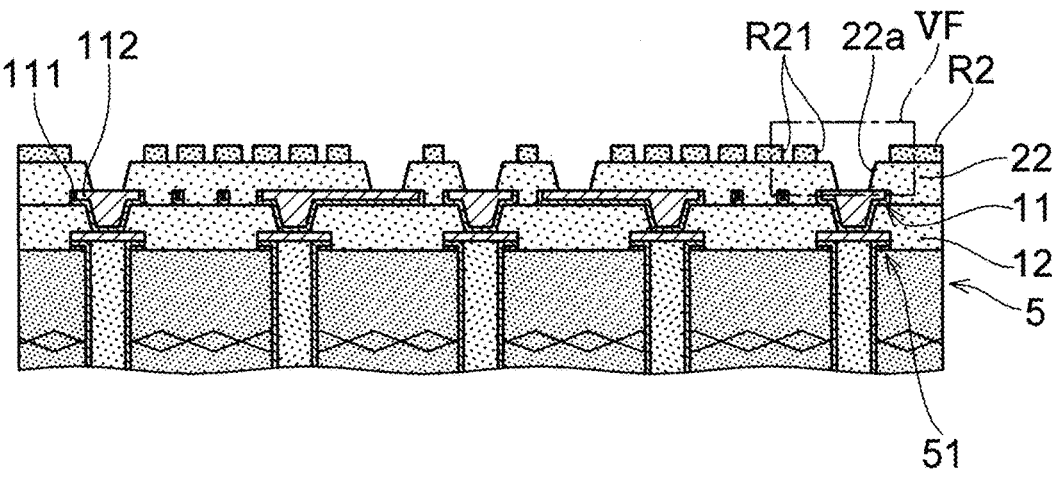
FIG. 5E is a cross-sectional view illustrating an example of a manufacturing process of a wiring substrate after FIG. 5D.
Figure 5F:
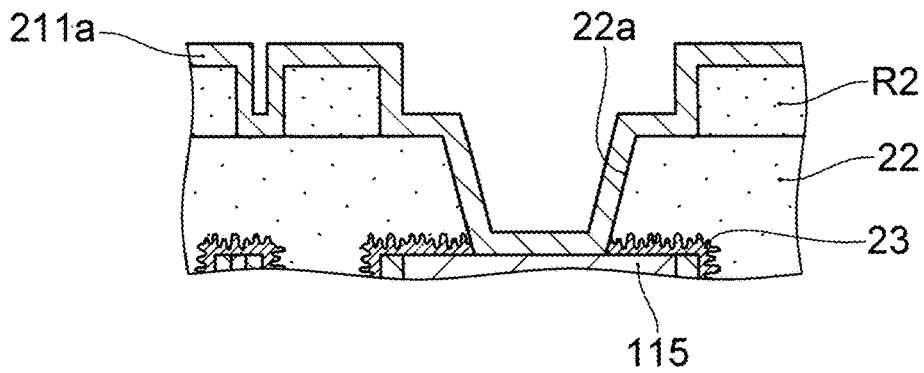
FIG. 5F is a partial enlarged view of VF in FIG. 5E illustrating in detail a manufacturing process of a wiring substrate after FIG. 5E.
Figure 5G:
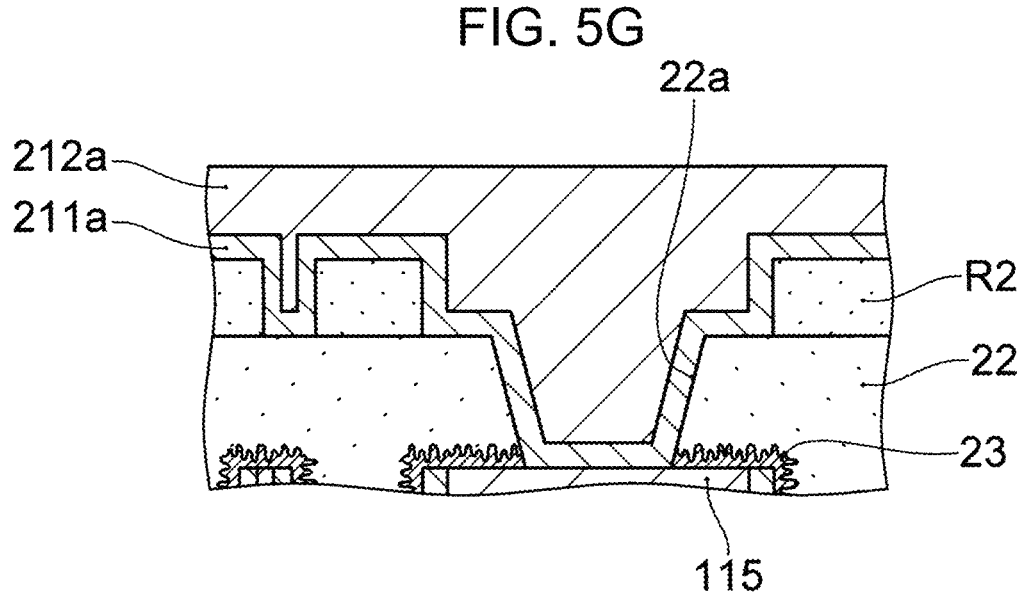
FIG. 5G is a partial enlarged view illustrating in detail a manufacturing process of a wiring substrate after FIG. 5F.
Figure 5H:
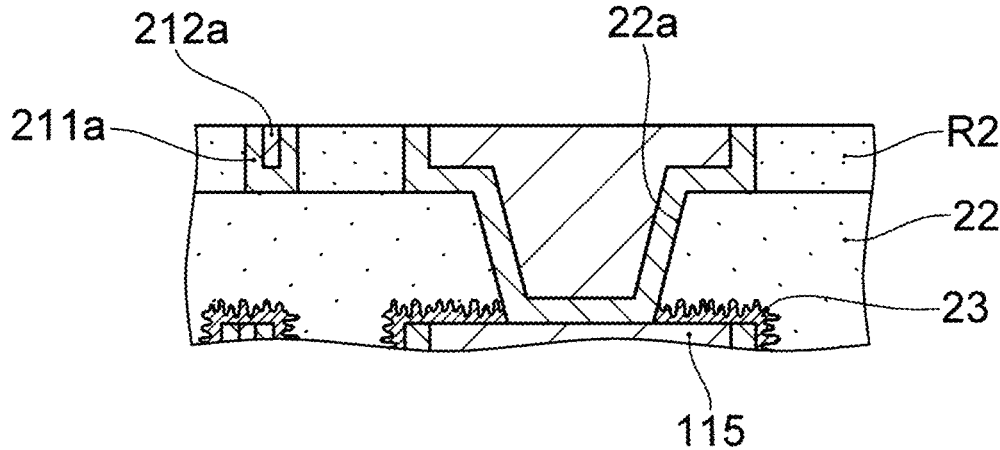
FIG. 5H is a partial enlarged view illustrating in detail a manufacturing process of a wiring substrate after FIG. 5G.

Regarding the formation of the conductor layer 21 (see FIG. 4), similarly, for example, as illustrated in FIG. 5E, first, the plating resist (R2) having the openings (R21) is provided on the upper surface of the insulating layer 22. Next, as illustrated in FIGS. 5F-5H, the metal film (211a) is formed by sputtering or the like (see FIG. 5F), the electrolytic plating film (212a) is formed by electrolytic plating using the metal film (211a) as a power feeding layer (seed layer) (see FIG. 5G), and the electrolytic plating film (212a), the metal film (211a), and the resist (R2) are partially removed in the thickness direction by polishing (see FIG. 5H). Next, although not illustrated, the plating resist (R2) is removed from the upper surface of the insulating layer 22. Thereby, the conductor layer 21 including the conductor pattern (21a) having a two-layer structure including the lower layer 211 and the upper layer 212 can be formed (see FIG. 4). As a result, in the conductor pattern (21a), the via land 215 connected to the via conductor 25, and the wiring pattern 216 including the first wiring (216a) and the second wiring (216b), which have high aspect ratios, can be formed (see FIG. 4). After that, similar to the embodiment described above, the surface of the wiring pattern 216 is covered by the organic coating film 33 (see FIG. 3O), the insulating layer 32 is laminated on the surfaces of the insulating layer 22 and the organic coating film 33 (see FIG. 3P), and the through hole (32a) is formed in the insulating layer 32 at a connection position between the wiring substrate 1 and an external component (see FIG. 3Q). Through the above processes, the formation of the wiring substrate 1 illustrated in FIG. 4 is completed.

When the conductor layer (11, 21) is formed in this way, a portion of the surface of the insulating layer (12, 22) that is exposed without being covered by the conductor pattern (11a, 21a) has not gone through a process of forming the metal film (111a, 211a) on the surface thereof, and thus is not a surface from which the metal film (111a, 211a) has been removed. Therefore, there are no residues of conductors or the like on the surface of the insulating layer (12, 22), and thus, even when wirings are formed at a fine pitch on the upper surface of the insulating layer (12, 22), it is thought that a defect such as a short circuit between the wirings is not caused to occur.

In the wiring substrate 1 of the embodiment described above, it is sufficient that the upper surface of at least one conductor layer is polished and is covered by an organic coating film. In other words, the other conductor layers may be formed using any other method for forming a conductor layer, in which the upper surface of a conductor layer is not polished (for example, any subtractive method including etching using an appropriate mask or the like, any semi-additive method (MSAP) using a metal foil, or the like).

Further, in the wiring substrate 1 of the embodiment described above, it is not always necessary to include wirings having high aspect ratios in a wiring pattern. When the wiring substrate 1 of the embodiment includes multiple conductor layers, it is also possible that there exists a conductor layer having a wiring pattern that does not include wirings having high aspect ratios. Further, when there exists a conductor layer having a wiring pattern that includes wirings having high aspect ratios, the wiring pattern may include any number of wirings having high aspect ratios.

Japanese Patent Application Laid-Open Publication No. 2003-258410 describes a method of manufacturing a wiring substrate in which an electroless copper plating layer and an electrolytic copper plating layer are sequentially laminated on an insulating substrate to form a wiring pattern. To make a film thickness of the wiring pattern uniform, a surface of the electrolytic copper plating layer is polished.

In the method for manufacturing a wiring substrate of Japanese Patent Application Laid-Open Publication No. 2003-258410, since the surface of the electrolytic copper plating layer, which is the surface of the wiring pattern, is a polished surface, it may be possible that adhesion between the surface of the wiring pattern and an insulating layer that covers the wiring pattern is reduced.

A wiring substrate according to an embodiment of the present invention includes: a first insulating layer; a first conductor layer that is formed on the first insulating layer; and a second insulating layer that covers the first conductor layer. The first conductor layer includes a first wiring pattern. A surface of the first wiring pattern on the opposite side with respect to the first insulating layer is a polished surface. The surface of the first wiring pattern is covered with an organic coating film.

According to an embodiment of the present invention, it is thought that the adhesion between the surface of the wiring pattern and the insulating layer is improved.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a first insulating layer;
a conductor layer formed on the first insulating layer and including a wiring pattern;
an organic coating film formed on the conductor layer such that the organic coating film is formed on the wiring pattern of the conductor layer and covering a side surface of the wiring pattern; and
a second insulating layer formed on the first insulating layer such that the second insulating layer is covering the conductor layer,
wherein the organic coating film is formed such that a root mean square height of the surface of the organic coating film is in a range of 0.010 μm to 0.100 μm, the conductor layer is formed such that the wiring pattern has a polished surface on an opposite side with respect to the first insulating layer and includes a first wiring and a second wiring formed adjacent to the first wiring, that each of the first wiring and the second wiring has a wiring width of 5 μm or less, and that a distance between the first wiring and the second wiring is 7 μm or less, the organic coating film is formed on the wiring pattern of the conductor layer such that the organic coating film is covering the polished surface of the wiring pattern, and the conductor layer includes a seed layer formed on the first insulating layer, and an electrolytic plating film formed on the seed layer such that the conductor layer is formed by forming a plating resist formed on the seed layer, forming on the seed layer exposed from the plating resist the electrolytic plating film having a thickness larger than a thickness of the plating resist, and reducing the thickness of the electrolytic plating film and the thickness of the plating resist by polishing.

2. The wiring substrate according to claim 1, wherein the conductor layer is formed such that the wiring pattern has an aspect ratio in a range of 2.0 to 4.0.

3. The wiring substrate according to claim 2, wherein the polished surface of the wiring pattern of the conductor layer has a surface structure formed by chemical mechanical polishing or sandblasting.

4. The wiring substrate according to claim 3, further comprising:
a second conductor layer formed on the first insulating layer on an opposite side with respect to the conductor layer; and
a via conductor comprising the electrolytic plating film filling a through hole penetrating through the first insulating layer such that the via conductor is connecting the conductor layer and the second conductor layer.

5. The wiring substrate according to claim 4, wherein the via conductor is formed such that the via conductor has an aspect ratio in a range of 0.5 to 1.0.

6. The wiring substrate according to claim 2, further comprising:
a second conductor layer formed on the second insulating layer; and
a via conductor formed in the second insulating layer such that the via conductor is connecting the first conductor layer and the second conductor layer,
wherein the conductor layer includes a conductor pad such that the conductor pad is connected to the via conductor, and the organic coating film is formed on the conductor layer such that the organic coating film is covering a surface of the conductor pad on an opposite side with respect to the first insulating layer and a side surface of the conductor pad except for a portion connected to the via conductor.

7. The wiring substrate according to claim 6, wherein the via conductor is formed such that the via conductor has an aspect ratio in a range of 0.5 to 1.0.

8. The wiring substrate according to claim 2, wherein the conductor layer is formed such that the seed layer includes a sputtering film.

9. The wiring substrate according to claim 1, wherein the conductor layer is formed such that the conductor layer has a thickness in a range of 7 μm to 20 μm.

10. The wiring substrate according to claim 9, wherein the conductor layer is formed such that the wiring pattern has an aspect ratio in a range of 2.0 to 4.0.

11. The wiring substrate according to claim 9, further comprising:
a second conductor layer formed on the second insulating layer; and
a via conductor formed in the second insulating layer such that the via conductor is connecting the first conductor layer and the second conductor layer,
wherein the conductor layer includes a conductor pad such that the conductor pad is connected to the via conductor, and the organic coating film is formed on the conductor layer such that the organic coating film is covering a surface of the conductor pad on an opposite side with respect to the first insulating layer and a side surface of the conductor pad except for a portion connected to the via conductor.

12. The wiring substrate according to claim 11, wherein the via conductor is formed such that the via conductor has an aspect ratio in a range of 0.5 to 1.0.

13. The wiring substrate according to claim 1, wherein the polished surface of the wiring pattern of the conductor layer has a surface structure formed by chemical mechanical polishing or sandblasting.

14. The wiring substrate according to claim 13, further comprising:

a second conductor layer formed on the first insulating layer on an opposite side with respect to the conductor layer; and a via conductor comprising the electrolytic plating film filling a through hole penetrating through the first insulating layer such that the via conductor is connecting the conductor layer and the second conductor layer.

15. The wiring substrate according to claim 14, wherein the via conductor is formed such that the via conductor has an aspect ratio in a range of 0.5 to 1.0.

16. The wiring substrate according to claim 13, wherein the conductor layer is formed such that the seed layer includes a sputtering film.

17. The wiring substrate according to claim 1, further comprising:

a second conductor layer formed on the second insulating layer; and

a via conductor formed in the second insulating layer such that the via conductor is connecting the first conductor layer and the second conductor layer, wherein the conductor layer includes a conductor pad such that the conductor pad is connected to the via conductor, and the organic coating film is formed on the conductor layer such that the organic coating film is covering a surface of the conductor pad on an opposite side with respect to the first insulating layer and a side surface of the conductor pad except for a portion connected to the via conductor.

18. The wiring substrate according to claim 17, wherein the conductor layer is formed such that the conductor layer has a thickness in a range of 7 μm to 20 μm.

19. The wiring substrate according to claim 17, wherein the via conductor is formed such that the via conductor has an aspect ratio in a range of 0.5 to 1.0.

20. The wiring substrate according to claim 1, wherein the conductor layer is formed such that the seed layer includes a sputtering film.

* * * * *